United States Patent [19]

Lama

[11] Patent Number: 5,130,607
[45] Date of Patent: Jul. 14, 1992

[54] COLD-CATHODE, ION-GENERATING AND ION-ACCELERATING UNIVERSAL DEVICE

[75] Inventor: Francesco Lama, Oxford, United Kingdom

[73] Assignee: Braink AG, Vaduz, Liechtenstein

[21] Appl. No.: 463,723

[22] Filed: Jan. 11, 1990

[30] Foreign Application Priority Data

Jan. 24, 1989 [CH] Switzerland ............................ 199/89
Oct. 25, 1989 [CH] Switzerland ........................... 3846/89

[51] Int. Cl.$^5$ ............................ H01J 1/30; H01J 27/02
[52] U.S. Cl. ........................... 315/111.81; 315/111.21; 315/111.31; 315/111.41; 313/231.31; 250/423 R
[58] Field of Search ...................... 315/111.21, 111.31, 315/111.41, 111.81; 313/231.31; 250/423 R

[56] References Cited

U.S. PATENT DOCUMENTS

| | | | |
|---|---|---|---|
| 3,955,118 | 5/1976 | Flemming | 315/111.81 |
| 4,262,056 | 4/1981 | Hubler et al. | 428/446 |
| 4,447,773 | 5/1984 | Aston | 315/111.31 X |
| 4,475,063 | 10/1984 | Aston | 315/111.81 |
| 4,652,795 | 3/1987 | Lee et al. | 315/111.41 |
| 4,707,637 | 11/1987 | Harvey | 315/111.81 |
| 4,710,283 | 12/1987 | Singh et al. | 204/298 |
| 4,716,340 | 12/1987 | Lee et al. | 315/111.41 |
| 4,733,631 | 3/1988 | Boyarsky et al. | 118/719 |
| 4,737,688 | 4/1988 | Collins et al. | 315/111.21 |
| 4,739,170 | 4/1988 | Varga | 250/427 |
| 4,774,437 | 9/1988 | Helmer et al. | 315/111.81 |
| 4,808,291 | 2/1989 | Denton et al. | 204/298 |
| 4,870,284 | 9/1989 | Hashimoto et al. | 315/111.81 X |
| 4,891,560 | 1/1990 | Okumura et al. | 315/111.41 |

Primary Examiner—Eugene R. LaRoche
Assistant Examiner—Do Hyun Yoo
Attorney, Agent, or Firm—Young & Thompson

[57] ABSTRACT

The device comprises an ionizing unit for the production of low-energy (100–1000 eV) ions (FIG. 2a) with a second negative medium voltage (−100 to −1000 V) grid (6') cathode (6), a second also grid (13') and low-voltage (0 to +100 V) anode (13) and a third medium voltage (−100 to −1000 V) accelerating cathode (12, 12'), to extract the ions from the unit of three grids (6', 13',12'). For the production of high-energy (from 10 to beyond 200 keV) ions (FIG. 3a) there are provided in succession starting from target (2): a first low-voltage (0 to +100 V) anode (7', 7"), a second low-voltage (0 to +50 V) grid (13$^{IV}$) anode (13), the second anode which cooperates to form with its central opening (13") an acceleration lens of the ion beam, a second medium negative voltage (−500 to −3000 V) grid (6") accelerating cathode (6) and a third accelerating cathode (12, 12") which, with its central opening 12", completes the acceleration lenses, the entire unit being arranged so as to direct the ion beam toward the bottom or in the desired direction.

2 Claims, 3 Drawing Sheets

COLD-CATHODE, ION-GENERATING AND ION-ACCELERATING UNIVERSAL DEVICE

FIELD OF THE INVENTION

The present invention relates to a cold-cathode, ion-generating and ion-accelerating universal device that makes it possible to generate ion beams of any material to be ionized that is electrically conductive, semiconductive or insulating, in the solid, liquid or gaseous state.

SUMMARY OF THE INVENTION

According to the invention, a cold-cathode, ion-generating and ion-accelerating universal device that makes it possible to generate ion beams of any material to be ionized that is electrically conductive, semiconductive or insulating, in solid, liquid or gaseous state, comprises a) a gasifying unit (1, 2) able to transform into gas, liquid or solid materials, even in granular form, without distinction and whatever their evaporation temperature, whether they are electrically conductive, semiconductive or insulating;

b) an ionizing unit (6, 7, 13) able to transform the atoms or molecules of gas, already existing in a gaseous state at a use temperature, or gasified by said gasifying unit (1, 2), into ions, providing them the ionization energy and thus producing a plasma; and c) an accelerating unit able to extract the ions present in the plasma generated by said ionizing unit (6, 7, 13) and to accelerate them, thus producing an ion beam.

The gasifying unit (1, 2) comprises a cold cathode (1) having the shape of a container able to contain ionizable material (2) without said material having to be fastened in any way to said container. The ionizing unit (6, 7, 13) comprises at least one grid electrode (6', 6", FIGS. 2a and 3a respectively) placed at said ionizable material (2) with interposition of a first low-voltage (0 to +200 V) anode (7', 7"). The accelerating unit comprises an accelerating grid (FIG. 2a) or lens (FIG. 3a) and electrodes.

DETAILED DESCRIPTION OF THE INVENTION

The detailed description of the various devices will be given below, taking as reference for the polarities and voltages cited in the entire text the common pole of the power supply sources of the various voltages and not the ground.

Figure 1:
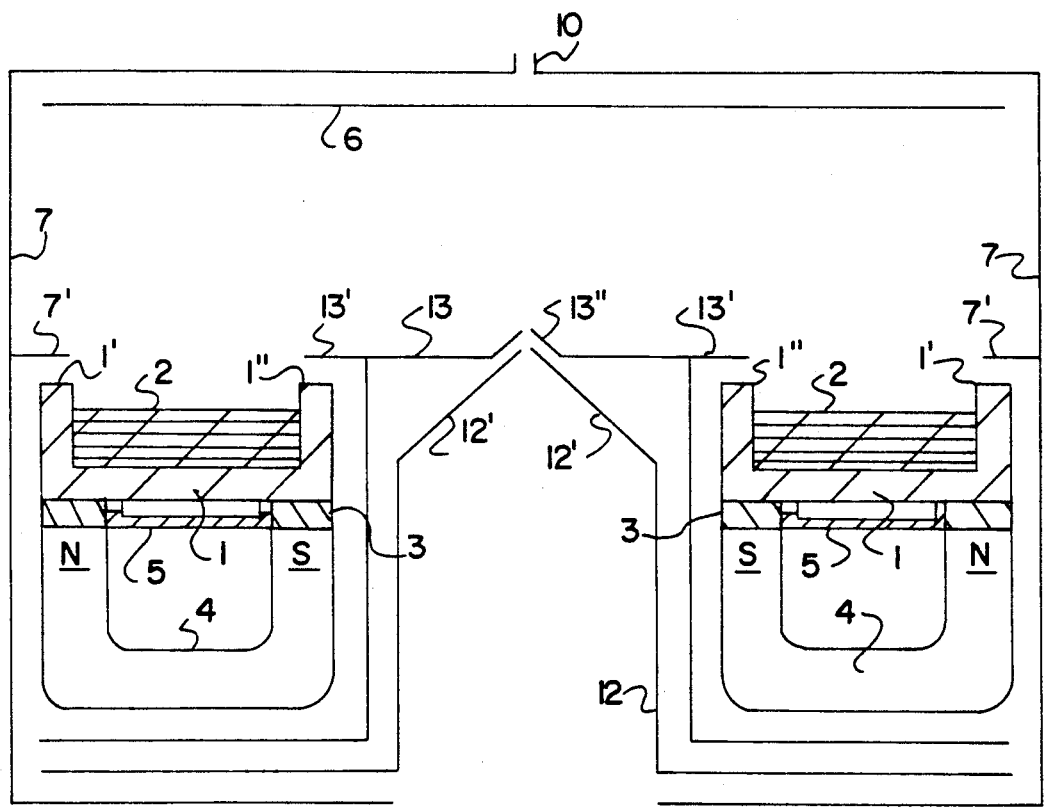
FIGS. 1, 2a, 2b, 2c, 2d show the device in question according to a first variant.

In FIG. 1 cold medium voltage (from −200 to −1500 volts) cathode 1 will be called "magnetron cathode" below since, to promote the ionization of the gas and to be able to reduce the supply voltage, a magnetic field is used in addition to the electric field. Such a field is generated by magnet (or electromagnet) 4.

The elements indicated by 1, 2, 3, 4, 5, in the various figures, constitute the magnetron cathode which can be shaped as a container that is circular, square, elliptical, rectangular or in another shape, without altering the feature of the invention.

This cathode exhibits a feature that distinguishes it from those known so far and consisting in the fact that target 2 is contained in a nonmagnetic metal container, without having to be fastened in any way. Thus, if the target is a metal with a low melting point, it remains in container 1 when it melts and is cooled by duct 5 (FIG. 1) in which cooling liquid flows. If then the metal has a high melting point, it is possible to place under it a strip of material with a low melting point, which guarantees a good thermal conduction. Of course, the specific weight of the material constituting the strip should be greater than that of the material constituting the target.

Permanent magnets are indicated by 4 (FIG. 1) and the relative pole pieces by 3. This group obviously can be replaced by an electromagnet. The first low voltage (0 to +100 V) anode is represented by cover 7, the second anode by disk 13, which can be supplied at the same voltage as the first, or at a slightly different voltage. Fins 13' and 7' of the first anode protect walls 1' and 1" of tank 1 from the discharge and prevent its erosion by the ions.

It is found, in the sputtering phenomenon, that the energy used for sputtering into atoms the material constituting cathode plate 2, target, corresponds with very good approximation to the energy of sublimation of the material itself. In substance, the magnetron cathode is able to gasify the substances that are not already in this state, or produces gas of the latter substances, intended for the ionization and subsequent acceleration by the unit.

The electric discharge is generated between the electrodes at a pressure less than atmospheric pressure, the magnetron cathode being contained in a closed environment, emptied of any gas and supplied auxiliary gas for the discharge, introduced through hole 10.

The chamber being suitably made, it is possible to reduce to a minimum and even to eliminate completely, after starting the source, the gas used for sputtering which is introduced through opening 10, using as the single gas that generated by the target atoms.

In case it is desired to use substances already in the gaseous state or easily vaporizable in a vacuum, without the need of supplying additional energy, the target can be reduced to minimal dimensions and made of graphite which exhibits an extremely reduced sputtering effect.

The magnetron cathode, or in any case gasifying cathode 1 even different from the magnetron or sputtering cathode, can also be supplied at high frequency.

But the gasification can take place by electron or ion gun, laser or other type.

The third element of the ion source consists of electrostatic lenses 13", 12' (FIG. 1) for extraction and acceleration of the ions, consisting of holes or slots through which the ion beam is formed. Said electrostatic lenses can optionally be replaced by magnetic lenses.

The ionization chamber is constituted by the second cathode, or ionizer 6 (FIG. 1) and by low-voltage anode 13. A second electric discharge is formed between the cathode and anode, promoted by the electrons and ions of the first, and this second discharge produces a high amount of ions by using the atoms that are detached from the target of the magnetron cathode. By suitably making this ionization chamber, it is possible to have a plasma rich in ions.

The third element, i.e., the unit of extraction lenses, consists of central part 13" of low-voltage anode 13 and top 12' of high-voltage cathode 12 which form two slots through which an ion beam is created. The indicated form of the lenses is not limiting, as the number of elements that make them up is not limiting, they being able to be more than two to obtain special characteristics of the beam. Also extraction of the beam toward the bottom is not a limiting condition, it also being able to be extracted on the side or toward the top. The slots of the lenses can be more than one, parallel to one another or can be made up of perforated grids. The various electrodes of this system are supplied at different voltages to be established depending on the energy to be supplied to the ions and the type of such ions.

Generally, target 2 should have a voltage between −200 and −1500 V, anodes 7 and 13 between 0 and +100 V, ionizer 6 between −500 and −3000 V and acceleration lens 12 between −10 kV and −500 kV. In case there are targets 2 consisting of insulating material, the related power supply should be in alternating current rather than direct current at frequencies normally between 1 and 50 MHz.

The value of the indicated voltages can vary to be able to obtain from the device of FIG. 1 the maximum efficiency necessary in the most diverse applications that require energy and dosages depending on the results it is desired to obtain.

Two other examples of practical application of the invention with electrodes or perforated grids are now presented: the first (FIG. 2a) for use of low-energy ions and the second (FIG. 3a) for use of high-energy ions; from these two applications others can be deduced that use intermediate energy by suitable modifications of the two systems represented, without altering the validity of the patent.

EXAMPLE I

In the use of ion sources, one of the best known processes is the so-called IBAD (Ion Beam Assisted Deposition). In this process, a low energy (100 to 1000 eV) ion source is used to obtain an improvement of the PVD (Physical Vapor Deposition) coating process, performed with devices such as thermal evaporators, electron guns, sputtering cathodes and others. The energy used is linked to the ions used and to the material constituting the substrate to be coated besides the coating material.

The solution described here makes it possible, with a single device, to perform the process and is not limited to the IBAD-PVD process but can also be usefully used for other types of processes such as, for example, ion beam etching or chemical vapor deposition.

There exist sources of this type described in U.S. Pat. Nos. 4,652,795; 4,710,283; 4,716,340; 4,774,437, which describe similar devices but none of them make it possible to use just any material, solid, liquid, gaseous or those solids in granular form or that melt at low temperature. A typical example of the latter is that of tin, used in sputtering units; in this case, the cathodes must be used as reduced power so as not to melt the tin target, while according to the present invention the unit can be used as maximum power.

Further, there is a notable difference between the device described in the cited patents and that of the present invention, since in the latter the atoms generated in the sputtering are ionized by the second cathode, while this does not happen in all the cited patents. This ionization, by suitably adjusting the dimensions of the various elements of the device, makes it possible to reduce to a minimum and even eliminate completely the gas used to start the sputtering discharge, as soon as it is begun, a fact that was foreseen, with different perception, even in U.S. Pat. No. 4,774,437, already cited. The second cathode, not provided in said patent, provides the system a greater elasticity and therefore a better ionization efficiency, as was already described in the preceding invention and as also appears below.

Figure 2A:
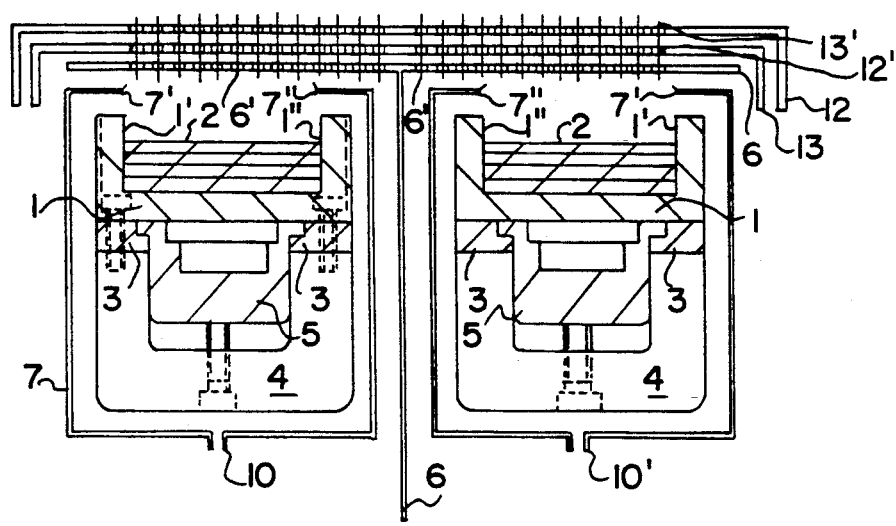

The device according to the first example, with extraction of the ions toward the top, is shown in FIG. 2a.

The system of gasification of the materials represented with numbers 1, 2, 3, 4, 5 and 7 can use a medium-voltage (from −200 to −1000 V) discharge, whose value is linked to the type of material of the target and to the gas used for the discharge, in the area of the so-called abnormal discharge, or low-voltage (−15 to −25 V) discharge, in the area of the arc discharge, without altering the validity of the device.

In the two cases, if materials are deposited that melt at high temperatures, target 2 can also be solidly anchored to pole pieces 3, for example, by screws countersunk in its periphery, and thus the device can be installed in any position, all without altering the validity of the invention.

In the device represented in FIG. 2a, 6 represents the second cathode that ends in a perforated grid 6', 13 represents the second anode that ends in a perforated grid 13', with holes of a diameter different from the first but coaxial, and 12' represents the acceleration grid with holes of a diameter different from the second, but coaxial.

The holes of the grids can be replaced by slots. The system of three perforated grids constitutes a lens system, all parallel, for which the method of calculation is known for determining the diameter of the holes and the distance between the grids. These grids can be made of graphite, silicon or refractory metal and the voltages applied to them can vary for the first and last from −100 to −3000 V and for the intermediate one from 0 to +150 V, with reference to the common pole of the power supplies and not to the ground.

The exact value of these voltages depends on the density and type of ions, as well as on the energy to be supplied to the ions on the basis of the type of process to be performed.

The distance between second cathode 6' and target 2 is linked to the intensity of the magnetic field, on which also depends the confining of the primary plasma, or that provided by the cathode sputtering. If this confining is correct, the distance between the second cathode and the target can be contained between 10 and 20 mm. This distance and the number of holes, on the basis of their diameter, are linked to the ratio between the ions of the primary gas used for sputtering the target and the ions of the target itself. This ratio is also linked to the type of gas used, to the type of target and to the working pressure.

In some cases it is preferable to have a small number or no ions of the gas; but in other cases it is desired that the ions of the gas react with the atoms of the material of the target and therefore in these cases it is necessary to have a sufficient amount of gas.

On the average, a ratio can be used between the sum of the area of the holes and the total area of 0.5.

According to tests performed in the laboratory with a similar device, it turned out that the ratio between ions and atoms of the material sputtered from the target is 4/1 for energies of 900 eV and 2/1 already for energies of 100 eV. Another advantage of the second cathode is that of causing a second discharge, therefore with broad limits independent of the first, of ionizing the atoms sputtered from the target, under the best efficiency conditions. Further, it is known that the maximum concentration of ions is located in the cathode dark space and therefore the ions are extracted precisely in this zone, guaranteeing the maximum efficiency of the device.

The gas used to generate the sputtering discharge of the target can be introduced through two openings 10 and 10' made in the back side of the anode.

For better understanding of the drawing, the outside cover and the system of insulators for fastening the various electrodes and maintaining the correct distance between them, as well as the intake and discharge pipes for cooling the target are omitted.

Figure 2B:
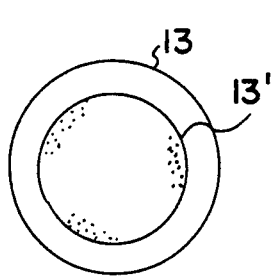
Figure 2C:
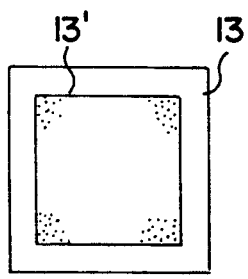
Figure 2D:
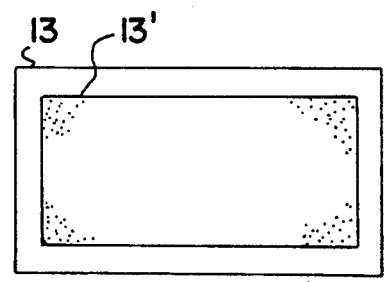

FIG. 2a represents only a section of the device that actually can have any shape: circular FIG. 2b, square FIG. 2c, rectangular FIG. 2d, etc., absolutely without altering the validity of the invention. In particular, in the rectangular embodiment the longer side can even be in the meters; consequently the present device, without losing any of its validity, is suitable both for use in small laboratory units and in "in-line" industrial units for continuous production.

EXAMPLE II

Figure 3A:
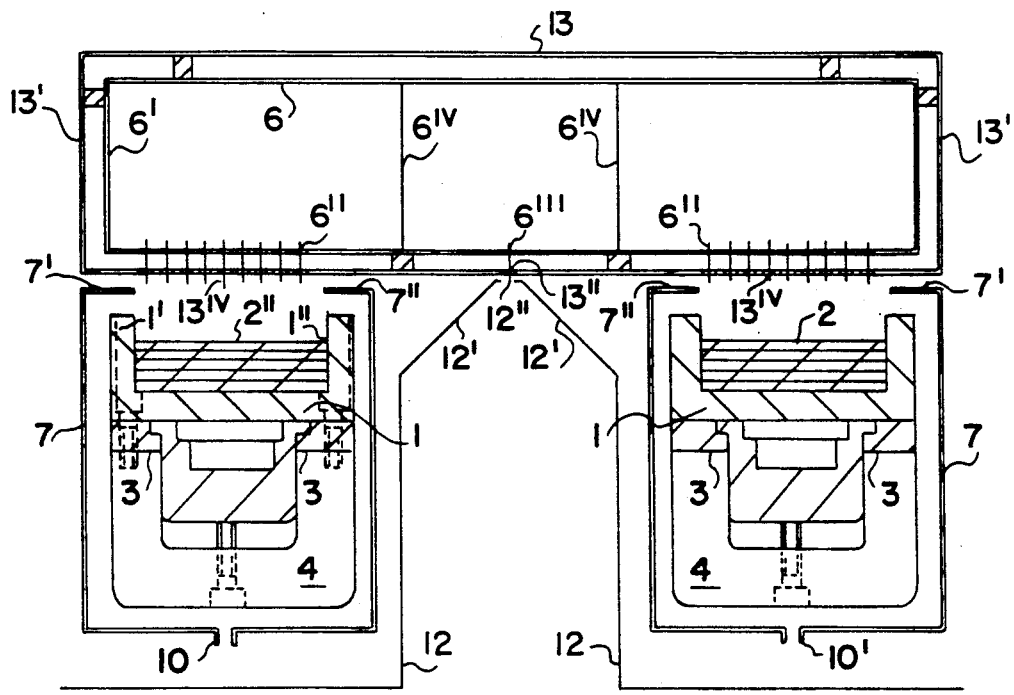
FIGS. 3a, 3b, 3c, 3d, 3e show the device in question according to the second variant.

The device shown in FIG. 3a, differing from the preceding one, generates and accelerates only ions.

This type of device is used mainly in two types of processes: ion implantation and ion mixing.

In the example of application that will be described, all the elements for gasification of the material represented in FIG. 3a by elements indicated by numbers 1, 2, 3, 4, 5 and 7 remain common to what has already been described in example I (FIG. 2a), therefore reference is made to example I (FIG. 2a), all the information already described remaining valid for example II.

The new part consists of second cathode 6 (ionizer) and lenses (13'', 6''', 12') for extraction of the ion beam.

Said extraction, unlike the preceding example, can be performed toward the bottom, toward the top (FIG. 3b) or also on the side, either (FIG. 3c) on one side or both sides; obviously it can be performed simultaneously from several parts, without thereby altering the validity of the invention.

The ionization chamber in this case consists of a box, generally of graphite or refractory metals, consisting of walls 6, 6' and 6'' and having a series of holes or slots in wall 6'' at the target intended to allow the atoms, which are detached from the target, to pass in the ionization chamber. In the low central part of the ionizer is also a slot 6''' that constitutes the extraction slot of the ion beam and that can be replaced by a series of holes.

FIG. 3a represents the solution with extraction of the beam toward the bottom, but in a perfectly analogous way the beam can also be extracted toward the top or side, by placing the extraction slot in the most suitable place either for the ionizer or for second anode 13' and accelerator 12'.

On the bottom of wall $6^{IV}$ of the box of the ionizer there are made a slot alone (FIG. 3d and 3e) or more than one, to uncover a part of second anode (13), in this way making it possible at the proper moment to trigger the second discharge, intended for the ionization of the atoms of the target which, as already said, being detached from it, are hurled into the ionizer through the holes of grid (6'').

Second cathode 6 is supplied at voltages between $-500$ and $-3000$ V and the second anode at voltages between 0 and $+50$ V, always with reference to the pole common to the power supplies and not to the ground.

The box-shaped construction of the ionizer offers two advantages: the first is that of having a large area of ionization of the atoms and the second is that of being able to reevaporate the nonionized atoms that had been deposited; in fact, by using as target materials that evaporate at high temperature it is possible to construct said box with the same material, thus guaranteeing a greater purity of the ions, without the necessity of using a magnetic analyzer of the ions. Actually, this source is provided to be used without an analyzer, which represents a great burden and a waste of energy for industrial uses.

However, obviously the analyzer can be used in all cases where it is absolutely necessary; moreover, the analyzer is not part of the present device, object of the invention, and therefore this type of complementary use is not described.

The atoms of the target can also be deposited on the anode, but in negligible amount since in the place where it is located, uncovered, it is not necessary to make holes in the base of the ionizer and, further, the voltage of the second anode can be regulated so that the electrons collected by it bring its surface temperature to such a value as not to allow the incoming atoms to condense. Further, it is not difficult to provide a masking that removes it from the arrival of said atoms. The particular construction of the box cathode can also be carried out with walls not at a right angle as in the figure, but can have any configuration intended to promote a greater density of ions, without thereby altering the validity of the invention.

As already said in example 1, extraction of the ions by ionizing cathode 12' makes it possible to perform this extraction where the concentration of ions is greater, namely in the cathode dark space.

Another advantage offered by this extraction system is represented by the fact that the ions attracted by the negative wall of cathode 6' being positive (negative ions require a different device) are subjected to a preacceleration that improves the functioning of the system for extraction of the ion beam.

The extraction system consists of three slots (6''', 13'', 12'') (or holes) located, respectively, on the ionizer, on the second anode and on the accelerator, slots that can be thought of as a system of electric lenses that can be calculated according to existing manuals and tables or also by resorting to suitably programmed computers.

Acceleration lens 12' can be provided at a certain distance from the other two (6''', 13'') to allow evacuation of possible residual gases in this zone by a suitable auxiliary pump, so as to have the minimum possible pressure in this acceleration zone, which means the smallest possible number of nonionized particles, with advantage for the correct functioning of this device. In some cases, the slots can be more than one, all parallel, and further the acceleration lenses can consist of a series of slots with increasing negative voltage, without thereby altering the validity of the invention.

The voltage of acceleration lenses 12' depends on the type of process for which the device is used and generally varies between $-20$ and $-200$ kV. All the power supplies of the ion source, as, moreover, is verified in the actually existing ones, have variable voltage regulated to be able to optimize the process.

The maximum energy obtainable with the ion source as described, for ions with single charge, exceeds 200 keV. However, it is possible, by using the well-known post-acceleration system, to double this energy. The post-acceleration system is not part of the present device and therefore is not described.

By constructing the ionizer with a sufficiently reduced volume with respect to its surface and by supplying it a sufficient voltage it is possible to obtain multiple-charge ions.

Therefore, if double-charge ions are available to obtain the above-mentioned energies, acceleration voltages equal to half are sufficient, with notable saving for the cost of power supplies; or with the same voltage, double energies with respect to single-charge ions can be obtained, which means it is possible to obtain, with the post-acceleration system, energies of 1 MeV for ions of any element.

Figure 3D:
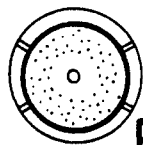
Figure 3E:
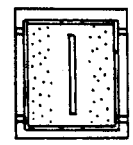
Figure 3B:
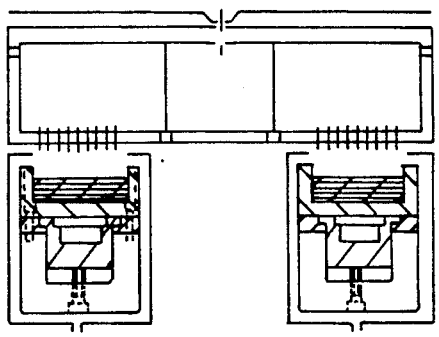
Figure 3C:
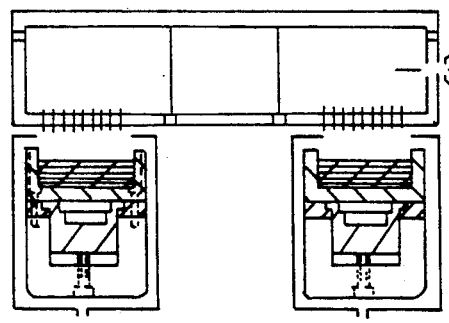

The device represented in FIG. 3a, in cross section, can have any shape, such as circular, square, rectangular, etc., as represented in FIGS. 3d and 3e.

Thus in the embodiment with circular or square shape, it is possible to provide ion beams with circular section even of very small section, while in the rectangular shape it is possible to generate beams with even very wide rectangular section, up to about a meter, which can be used for large industrial productions both for single chamber units and "in-line" units for continuous production.

I claim:

1. In a cold-cathode, ion-generating and ion-accelerating universal device that makes it possible to generate ion beams of any material (2) to be ionized that is electrically conductive, semiconductive or insulating, in solid, liquid or gaseous state, comprising
   a) a gasifying unit (1, 2) for gasifying said material;
   b) an ionizing unit (6, 7, 13) able to transform the atoms or molecules of gas gasified by said gasifying unit (1, 2), into ions, providing them the ionization energy and thus producing a plasma; and
   c) an accelerating unit able to extract the ions present in the plasma generated by said ionizing unit (6, 7, 13) and to accelerate them, thus producing an ion beam; the improvement wherein said gasifying unit (1, 2) comprises a cold cathode (1) having the shape of a container able to contain said ionizable material (2) without said material having to be fastened in any way to said container; and said accelerating unit comprises at least one grid electrode (6', 6", FIGS. 2a and 3a respectively) placed adjacent said ionizable material (2) with interposition of a low-voltage (0 to +100 V) anode (7', 7") between said at least one grid electrode and said ionizable material.

2. Device according to claim 1, wherein said gasifying unit comprises the cathode (1) having negative medium voltage (−200 to −1500 V), and the device further comprises magnets (4) or electromagnets (4), with pole pieces (3), and a cooling means (5) for cooling said gasifying unit, wherein said cathode is contained in a closed evacuated environment fed with an auxiliary gas for discharge, introduced by holes (10, 10', FIGS. 1, 2a and 3a) to generate, by the discharge, ions of this auxiliary gas.

* * * * *